(12) United States Patent
Amarilio et al.

(10) Patent No.: US 7,735,041 B2
(45) Date of Patent: Jun. 8, 2010

(54) METHODS AND COMPUTER READABLE MEDIA IMPLEMENTING A MODIFIED ROUTING GRID TO INCREASE ROUTING DENSITIES OF CUSTOMIZABLE LOGIC ARRAY DEVICES

(75) Inventors: Lior Amarilio, Yokneam (IL); Yoav Segal, Modiin (IL)

(73) Assignee: ChipX, Inc., Santa Clara, CA (US)

( * ) Notice: Subject to any disclaimer, the term of this patent is extended or adjusted under 35 U.S.C. 154(b) by 684 days.

(21) Appl. No.: 11/499,913

(22) Filed: Aug. 3, 2006

(65) Prior Publication Data

US 2008/0034341 A1    Feb. 7, 2008

(51) Int. Cl.
    G06F 17/50    (2006.01)
(52) U.S. Cl. .................... 716/10; 716/1; 716/12
(58) Field of Classification Search ......... 716/1, 716/10, 12
    See application file for complete search history.

(56) References Cited

U.S. PATENT DOCUMENTS

| | | | |
|---|---|---|---|
| 5,764,485 A * | 6/1998 | Lebaschi | 361/774 |
| 5,831,867 A * | 11/1998 | Aji et al. | 716/4 |
| 5,861,641 A | 1/1999 | Yoeli et al. | |
| 6,026,224 A * | 2/2000 | Darden et al. | 716/10 |
| 6,166,560 A | 12/2000 | Ogura et al. | |
| 6,294,927 B1 | 9/2001 | Yoeli et al. | |
| 6,331,790 B1 | 12/2001 | Or-Bach et al. | |
| 6,459,136 B1 | 10/2002 | Amarilio et al. | |
| 6,525,350 B1 * | 2/2003 | Kinoshita et al. | 257/202 |
| 6,696,856 B1 | 2/2004 | Smith et al. | |
| 6,750,541 B2 * | 6/2004 | Ohtsuka et al. | 257/750 |
| 6,873,185 B2 | 3/2005 | Cox | |
| 6,903,390 B2 | 6/2005 | Amarilio et al. | |
| 6,924,662 B2 | 8/2005 | Amarilio et al. | |
| 7,446,352 B2 * | 11/2008 | Becker et al. | 257/206 |
| 7,511,536 B2 * | 3/2009 | Amarilio et al. | 326/101 |
| 2003/0234666 A1 | 12/2003 | Cox | |
| 2004/0027156 A1 * | 2/2004 | Amarilio et al. | 326/47 |
| 2006/0081583 A1 * | 4/2006 | Hembree et al. | 219/209 |
| 2006/0195810 A1 * | 8/2006 | Morton | 716/14 |

* cited by examiner

*Primary Examiner*—Jack Chiang
*Assistant Examiner*—Suchin Parihar
(74) *Attorney, Agent, or Firm*—Pillsbury Winthrop Shaw Pittman LLP

(57) ABSTRACT

Disclosed are a method and a computer readable medium for increasing routing density in cells of a customizable logic array device. In one embodiment, the method includes modifying a connectivity grid for manufacturing the customizable logic array device to form a noncompliant connectivity grid, and forming via caps in association with the noncompliant connectivity grid in either a first direction or a second direction, which can be substantially orthogonal to the first direction in some embodiments. The via caps are configured to provide each via with an amount of overlap area for sufficient coverage. In some instances, the method also includes forming a configuration layer for routing among a subset of the vias to provide at least the amount of overlap area for each via in the subset, and for forming the via caps for unrouted vias that are not part of the subset.

20 Claims, 14 Drawing Sheets

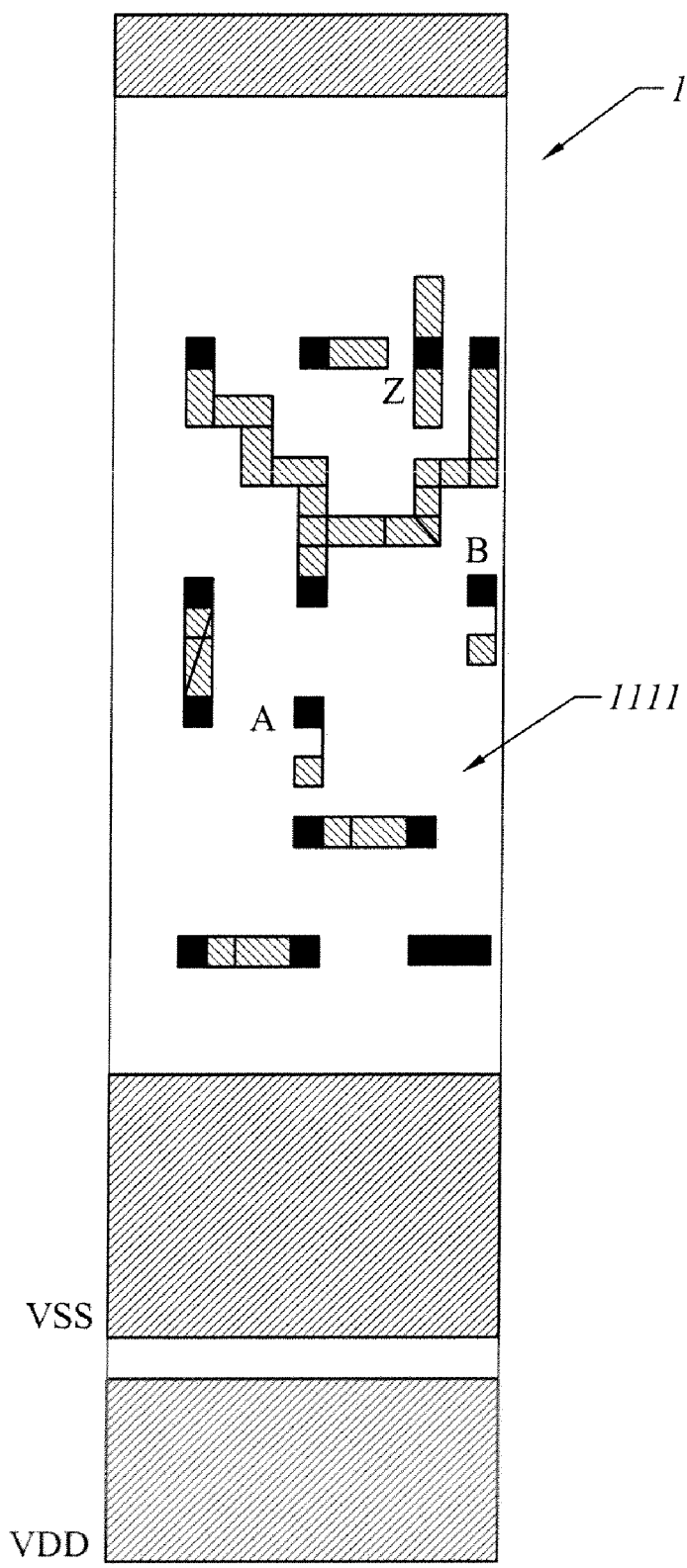
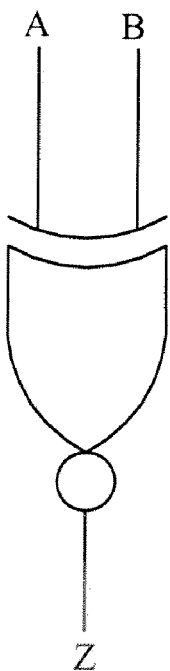
FIG. 11B
FIG. 11A

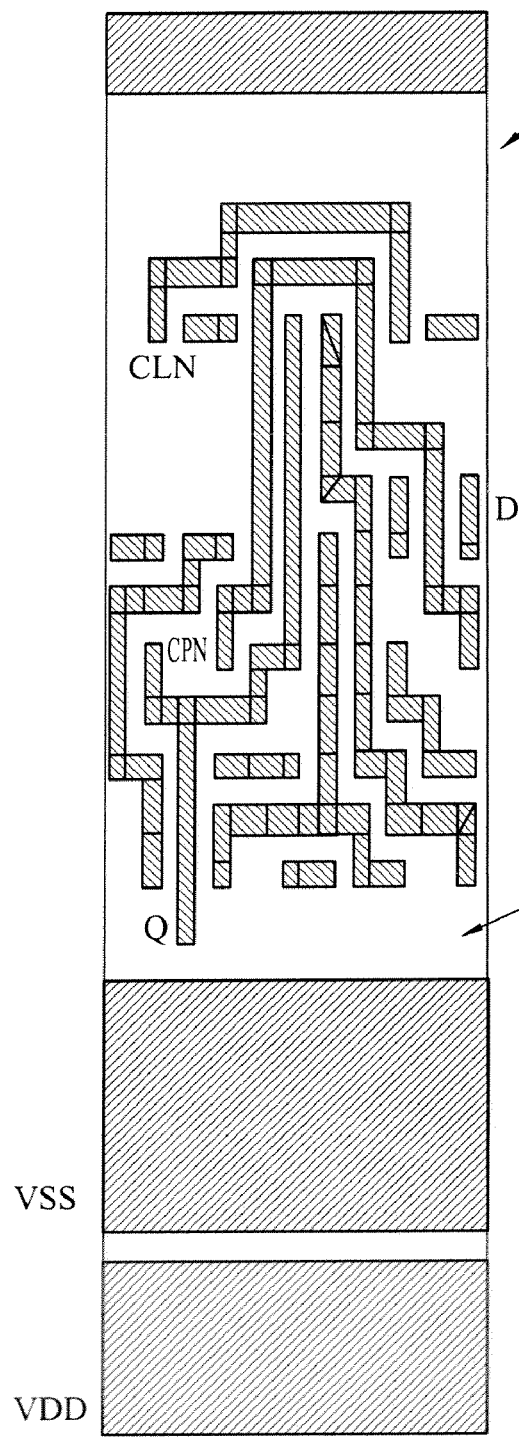
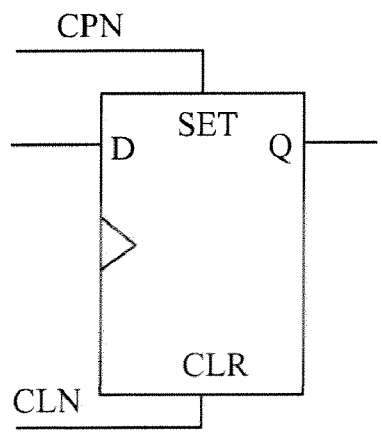
FIG. 13A
FIG. 13B

METHODS AND COMPUTER READABLE MEDIA IMPLEMENTING A MODIFIED ROUTING GRID TO INCREASE ROUTING DENSITIES OF CUSTOMIZABLE LOGIC ARRAY DEVICES

CROSS REFERENCE TO RELATED APPLICATIONS

This application is related to the U.S. patent application Ser. No. 11/499,899, entitled "Cells of a Customizable Logic Array Device having Independently Accessible Circuit Elements", which was filed on Aug. 3, 2006 and commonly owned by Chip-X, Inc., the contents of which are incorporated herein by reference.

BRIEF DESCRIPTION OF THE INVENTION

This invention relates generally to structured application-specific integrated circuits ("ASICs") having a customizable logic array architecture, and more particularly, to methods for using a modified routing grid to manufacture a cell structure having increased routing densities, among other things.

BACKGROUND OF THE INVENTION

Design rules commonly govern the manufacture of macrocells and standard cells, either of which form a portion of a customizable logic array structure or the like. For example, most manufacturing processes require a minimum separation distance between conductors, such as traces and vias. To maintain a minimum separation distance, traces are usually routed along a grid, which is also known as a "routing grid." Vias are also typically formed upon the grid. Further, manufacturing processes require a minimum amount of area to cover or overlap vias. As such, vias have dimensions that typically extend beyond the width of a trace. So by placing vias on a grid, the minimum separation distance increases to accommodate the vias. This, in turn, decreases routing density.

FIG. 1A is a diagram showing a traditional routing grid 100 composed of vertical grid lines 110 and horizontal grid lines 120 that are spaced apart by a vertical grid spacing ("g.s.(v)") 111 and a horizontal grid spacing ("g.s.(h)") 113, respectively. Via cap 102 includes an area, A, that is sufficient to cover a via to meet a minimum amount of coverage area. Further, via cap 102 is positioned a minimum separation distance ("d") 115 from any of the grid lines over which another via or trace can be disposed. But vertical grid spacing 111 and horizontal grid spacing 113 can contribute to a reduced routing density.

FIG. 1B is a diagram showing an improved routing grid 150 designed to reducing at least one of the spacings between the grids. Improved routing grid 150 has vertical grid lines 160 and horizontal grid lines 170, which are spaced apart by vertical grid spacing ("g.s.(v)") 151 and horizontal grid spacing ("g.s.(h)") 153, respectively. Here, Via cap 102 vertical grid spacing ("g.s.(v)") 151 is reduced in comparison vertical grid spacing 111 of FIG. 1A to improve routing density. To satisfy the requirement to cover vias (not shown) with via cap 152 having at least a minimum amount of area, A, via cap 152 is extended in a direction so as to maintain distance ("d") 115. Consequently, horizontal grid lines 170a, which are shown as dashed lines, are typically removed to accommodate the extended vertical dimension of via cap 152 that is necessary to comply with design rules. This increases horizontal grid spacing 153 Further, via cap 102 is positioned a minimum separation distance ("d") 115 from any of the grid lines over which another via or trace can be disposed. But vertical grid spacing 111 and horizontal grid spacing 113 can contribute to a reduced routing density, especially when routing grid 150 is used for manufacturing multiple layers.

In view of the foregoing, it would be desirable to provide cells, methods and computer readable media that minimize the above-mentioned drawbacks and provide for a modified routing grid and an extended via cap to enhance routing density.

SUMMARY OF THE INVENTION

Disclosed are a method and a computer readable medium for increasing routing density in cells of a customizable logic array device. In one embodiment, the method includes modifying a connectivity grid for manufacturing the customizable logic array device to form a noncompliant connectivity grid, and forming via caps in association with the noncompliant connectivity grid. The via caps can be formed, for example, in either a first direction or a second direction, which can be substantially orthogonal to the first direction. The via caps are configured to provide each via with an amount of overlap area for sufficient coverage. In some instances, the method also includes forming a configuration layer for routing among a subset of the vias to provide at least the amount of overlap area for each via in the subset, and/or for forming at least one via cap for an unrouted via that is not part of the subset.

In a specific embodiment, modifying the connectivity grid includes narrowing grids in the first direction to a first distance to form a first set of narrowed grids, and narrowing grids in the second direction to a second distance to form a second set of narrowed grids. For example, narrowing the grids to the first distance and the second distance can include sizing the first set of narrowed grids and the second set of narrowed grids, respectively, to accommodate the dimensions of a via in compliance with a design rule. Sizing the first set of narrowed grids and the second set of narrowed grids further includes establishing a boundary about the via with which no conductor can contact. As such, the boundary can be established to enclose less area than is required for the amount of overlap area, thereby violating another design rule specifying a minimum overlap area for compliance. The conductor can be either a routing trace or another via. Note that the via can be located at an intersection of one grid from the first set and another grid from the second set.

In another embodiment, a method for manufacturing cells of a customizable logic array device having an enhanced routing density includes forming circuit elements including one or more input terminals and one or more output terminals, placing vias at the input terminals and the output terminals in violation of a rule defining a minimum separation, and routing traces among the vias to form routed vias that include an amount of area that complies with another rule. The method continues by forming via caps on remaining vias in any direction in which a via cap extends at least the minimum separation. The via cap provides an amount of overlap area in compliance with the other rule defining a minimum amount of via cap area.

In yet another embodiment, a computer readable medium is configured to form a higher-level logic element, such as a flip flop, from one or more cells of a customizable logic array device having an enhanced routing density. For example, the computer readable medium for forming a flip flop can include executable instructions to establish in one or more base layers a multiplexer, a NAND gate, and one or more inverters, each of which includes one or more input terminals and one or more output terminals. The computer readable medium can also include executable instructions to interconnect one or more configuration layers to the one or more base layers to form connections at locations that deviate from recommended locations, and to route traces among a first subset of the connections to form the flip flop from the multiplexer, the NAND gate, and the one or more inverters. In some cases, the computer readable medium can include executable instructions to cap a second subset of the connections each with an overlap area compliant with a predetermined minimum amount of area.

BRIEF DESCRIPTION OF THE FIGURES

The invention is more fully appreciated in connection with the following detailed description taken in conjunction with the accompanying drawings, in which:

The invention is more fully appreciated in connection with the following detailed description taken in conjunction with the accompanying drawings, in which:

FIGS. 10A to 13B are plan views for examples of cell structures configured to implement various high-level logic devices, according to various embodiments of the invention.

Like reference numerals refer to corresponding parts throughout the several views of the drawings. Note that most of the reference numerals include one or two left-most digits that generally identify the figure that first introduces that reference number.

Like reference numerals refer to corresponding parts throughout the several views of the drawings. Note that most of the reference numerals include one or two left-most digits that generally identify the figure that first introduces that reference number.

DETAILED DESCRIPTION FOR EXAMPLES OF EMBODIMENTS

Figure 1A:
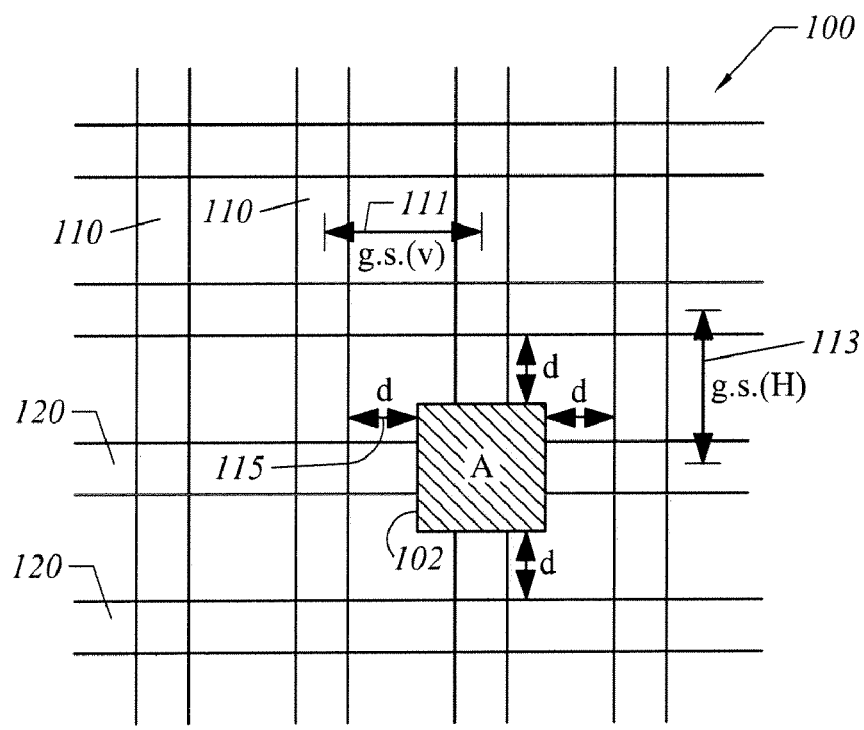
FIGS. 1A and 1B are diagrams showing a traditional routing grids for manufacturing structured ASIC cells.
Figure 1B:
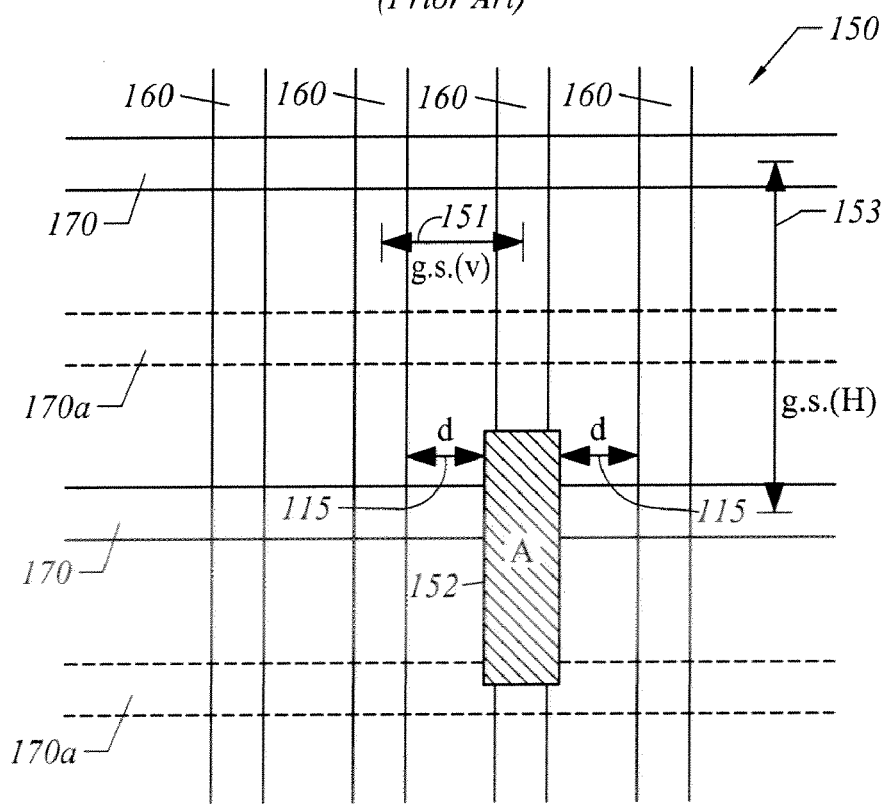
Figure 2A:
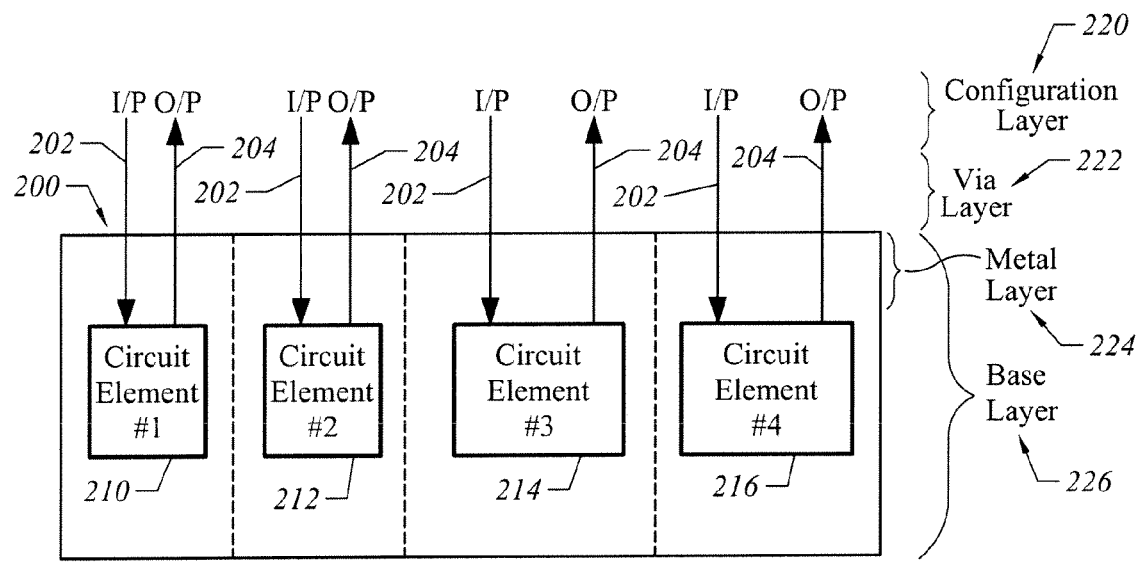
FIG. 2A is a block diagram illustrating a cell structure for a customizable logic array device, according to at least one specific embodiment of the invention.

FIG. 2A is a block diagram illustrating a cell structure for a customizable logic array device, according to at least one specific embodiment of the invention. Cell 200 includes a number of circuit elements 210, 212, 214, and 216, each of which is independently accessible from locations external from cell 200. Circuit elements 210, 212, 214, and 216 include one or more inputs ("I/P") 202 and one or more outputs ("O/P") 204 that extend up through an interlayer connection layer, such as via layer 222, to at least to a top layer, such a configuration layer 220. Generally, the interlayer connection layer connects each input 202 and output 204 to configuration layer 220 so as to enable each of the circuit elements to be independently accessible. As used herein, the term "independently accessible" refers in some embodiments to the availability of individual inputs 202 and outputs 204 for either routing with other inputs 202 and outputs 204 of the same or different circuit elements to form, for example, a higher-level logic device such as a flip-flop. In some cases, one or more inputs 202 and outputs 204 are available for forming a via cap (not shown) having a requisite area thereupon.

Advantageously, the interlayer connection layer facilitates usage of circuit 210, 212, 214, and 216 to reduce the number of unused circuit elements in cell 200. Thus, customizable logic array devices using cell 200 can be manufactured to include all layers up to configuration layer 220, where they then can be placed in inventory. The independently accessible nature of the circuit elements enables them to be used for any application, unlike traditional customizable logic cells that generally are pre-configured. That is, some conventional cells either have internal connections with circuits elements (i.e., not individually accessible) or do not bring individual inputs and output to a configuration layer, thereby wasting resources. Either makes the cells less adaptable for other applications. Further, cell 200 conceptually can be viewed having an EDA tools-adapted layer (i.e., the configuration layer or upper layer) for forming a library of higher-level logic devices and a circuit implementation layer (i.e., lower layer of transistors). While the higher-level logic devices are formed at configuration layer 220 within predefined boundaries for describing polygons (for routing traces), the underlying transistors at base layer 226 need not be bounded those predefined boundaries, and, thus can be advantageously arranged to optimize circuit densities.

As shown, cell 200 includes a base layer 226 in which the transistor devices constituting the circuit elements 210, 212, 214, and 216 can be formed within a semiconductor layer (not shown). A conductive layer, such as metal layer 224, forms connections among the transistors of each of the circuit elements. In some cases, metal layer 224 is routed in accordance with a modified connectivity grid that violates at least a design rule pertaining to a minimum spacing between conductors, such as between a via (or via cap) and a trace. By ignoring such a design rule and routing traces closer together, routing density increases. Further, the interlayer connection layer can be formed in violation of another design rule by locating vias in a manner that the minimum area of overlap for the via cannot be satisfied without violating the minimum spacing rule. Note that configuration layer 220 can be configured to remedy this type of violation. For example, configuration layer 220 can add area to via caps by either connecting a trace to a particular via or forming a multi-dimensional via cap, which is described below, in any direction that complies with the minimum spacing rule. Note that via layer 222 and metal layer 224 can be viewed conceptually as different layers that can be combined into one or more fixed metal layers, according to some embodiments of the invention. As such, via layer 222 can be omitted and vias can be formed as part of a fixed metal layer 224.

Figure 2B:
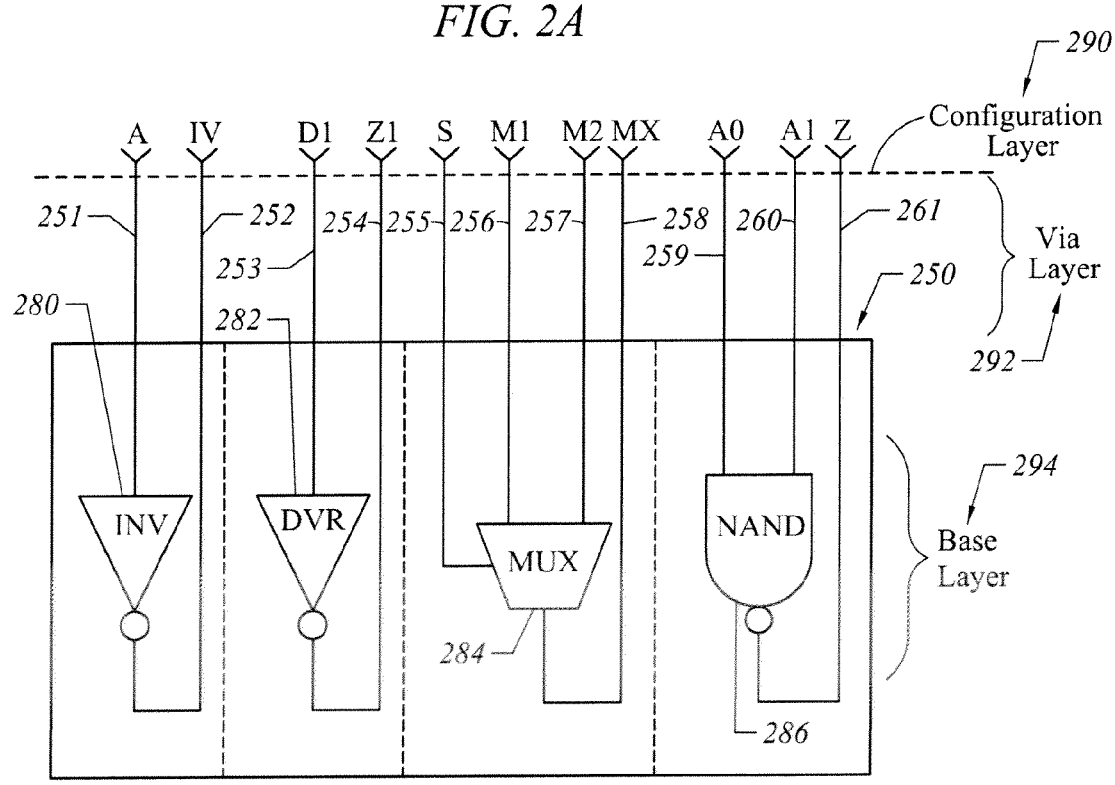
FIG. 2B is a block diagram illustrating one example of a cell structure that forms a portion of a customizable logic array device, according to at least one specific embodiment of the invention.

FIG. 2B is a block diagram illustrating one example of a cell structure for a customizable logic array device, according to at least one specific embodiment of the invention. Cell 250 includes a number of circuit elements including an inverter ("INV") 280, a driver ("DVR") 282, a multiplexer ("MUX") 284, and a NAND gate ("NAND") 286. These circuit elements are formed in a base layer 294 and each include one or more input terminals and one or more output terminals for coupling to, for example, vias. Inverter 280 has an input ("A") 251 and an output ("IV") 252, whereas driver 282 has an input ("D1") 253 and an output ("Z1") 254. Multiplexer 284 has a select input terminal ("S") 255, two input terminals ("M1") 256 and ("M2") 257, and an output terminal ("MX") 258. NAND 286 has two input terminals ("A0") 259 and ("A1") 260, and an output terminal ("Z") 261. These input and output terminals extend up through a via layer 292 to configuration layer 290, which establishes a minimum area of via overlap for the input terminals and output terminals for inverter 280, driver 282, multiplexer 284, and NAND gate 286. The minimum area of via overlap is formed to avoid a violation of a design rule specifying a requisite amount of overlap. Note that cell 250 can include any number or any type of circuit element, including OR gates, AND gates, etc., as well as more sophisticated logic elements. Note, too, that any of these input terminals and output terminals can be coupled within the boundaries of cell 250 to form a higher-level logic device, such as a flip-flop. Or, these terminals can be individually or collectively connected with inputs and the outputs of other cells (not shown) to form other logic devices.

In one embodiment, via layer 292 is formed at locations determined in accordance with a non-compliant connectivity grid, whereby at least one distance measurement violates a minimum distance. Further, via layer 292 is further configured to connect each of the input terminals and the output terminals to configuration layer 290 so as to be independently accessible. Configuration layer 290 is configured to establish a minimum area of overlap (not shown) for each of the input terminals and the output terminals by including either an enlarged via cap in a direction that does not violate the minimum distance, or a trace to establish a connection with another via. Specifically, configuration layer 290 includes a multi-dimensional via cap that extends in either a first direction or a second direction, which is substantially orthogonal to the first direction. As used herein, the term "multi-dimensional via cap" in some embodiments refers to a via cap that can be formed in any direction, for example, in two dimensions, unlike conventional via caps that are extended in only a vertical direction or a horizontal direction.

Figure 3A:
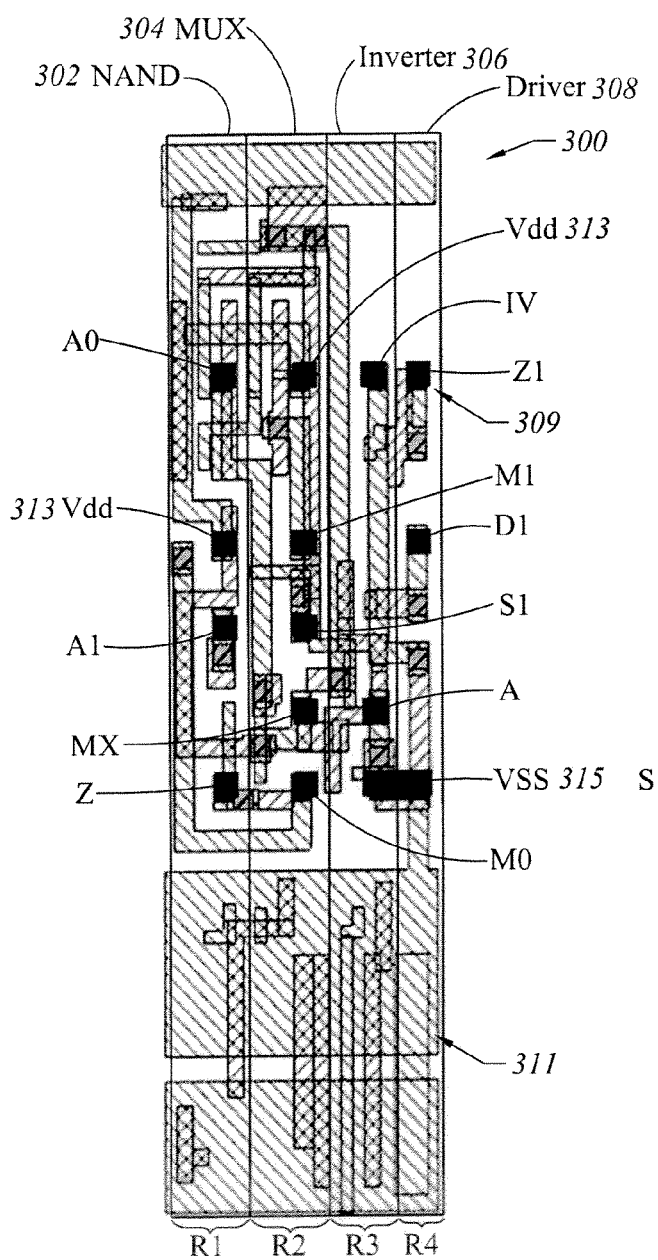
FIG. 3A is a plan view of one example of a cell structure for a customizable logic array device, according to at least one specific embodiment of the invention.

FIG. 3A is a plan view of one example of a cell structure for a customizable logic array device, according to at least one specific embodiment of the invention. Cell 300 includes a number of circuit elements described in FIG. 2B. In particular, cell 300 includes a NAND gate ("NAND") 302, a multiplexer ("MUX") 304, an inverter 306, and a driver 308. Each of the output and input terminals for cell 300 are represented by darkly shaded contacts or vias 309. As shown, the input and output terminals for the circuit elements are exposed up to configuration layer 311, which in this figure, is a top layer. Advantageously, each of these input and output terminals are independently accessible, thereby creating a fine grain architecture for the customizable logic array. Shown, too, are power contacts or vias, such as Vdd 313 and Vss 315 for providing power connections to cell 300. In some embodiments, the placement of the input and output terminals on configuration layer 311 accommodates shorter traces to implement a specific logic device, thereby saving routing resources.

Figure 3B:
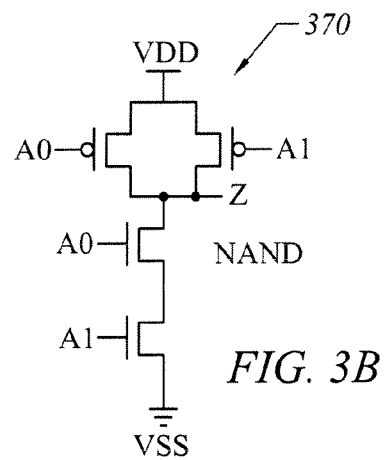
FIGS. 3B to 3D are schematics for circuit elements described in FIG. 3A, according to an embodiment of the invention.
Figure 3C:
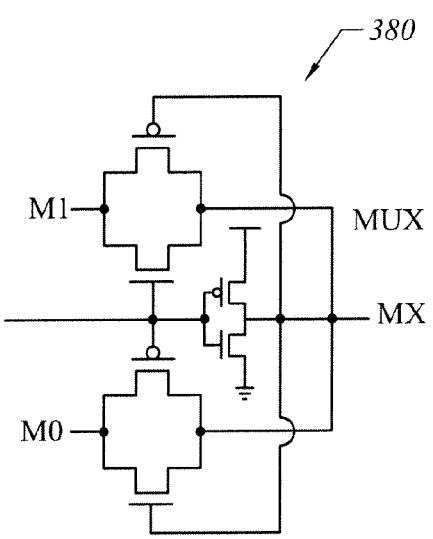
Figure 3D:
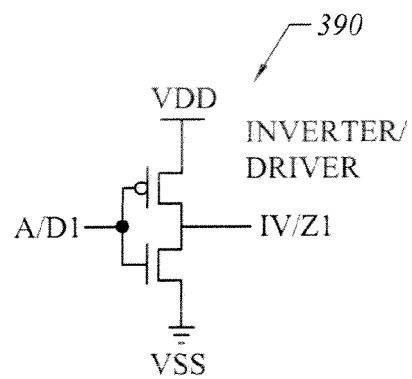

FIG. 3B is a schematic for NAND 370, which represents an example of NAND 302 having two input terminals A0 and A1, and an output terminal Z. FIG. 3C is a schematic for MUX 380 (shown as a pass gate multiplexer) representing an example of a structure for MUX 304 having a select input terminal S, two input terminals M1 and M2, and an output terminal MX. FIG. 3D is a schematic for an Inverter and/or Driver 370, which represents an example of inverter 306 having an input terminal A and an output terminal IV. Inverter and/or Driver 370 can also represent a structure for driver 308 having an input terminal D1 and an output terminal Z1. While FIG. 3A depicts input and output terminals for NAND gate 302, multiplexer 304, inverter 306, and driver 308 disposed in regions R1, R2, R3 and R4, respectively, note that the underlying transistors, such as those depicted in FIGS. 3B to 3D, can be located any where within the boundaries of cell 300 (i.e., each circuit element need not be restricted to a particular region). Generally, the active circuitry constituting circuit elements 370, 380 and 390 can advantageously reside in closer proximity to each other than is generally the case with conventional customizable logic cells, thereby increasing circuit density.

Figure 4:
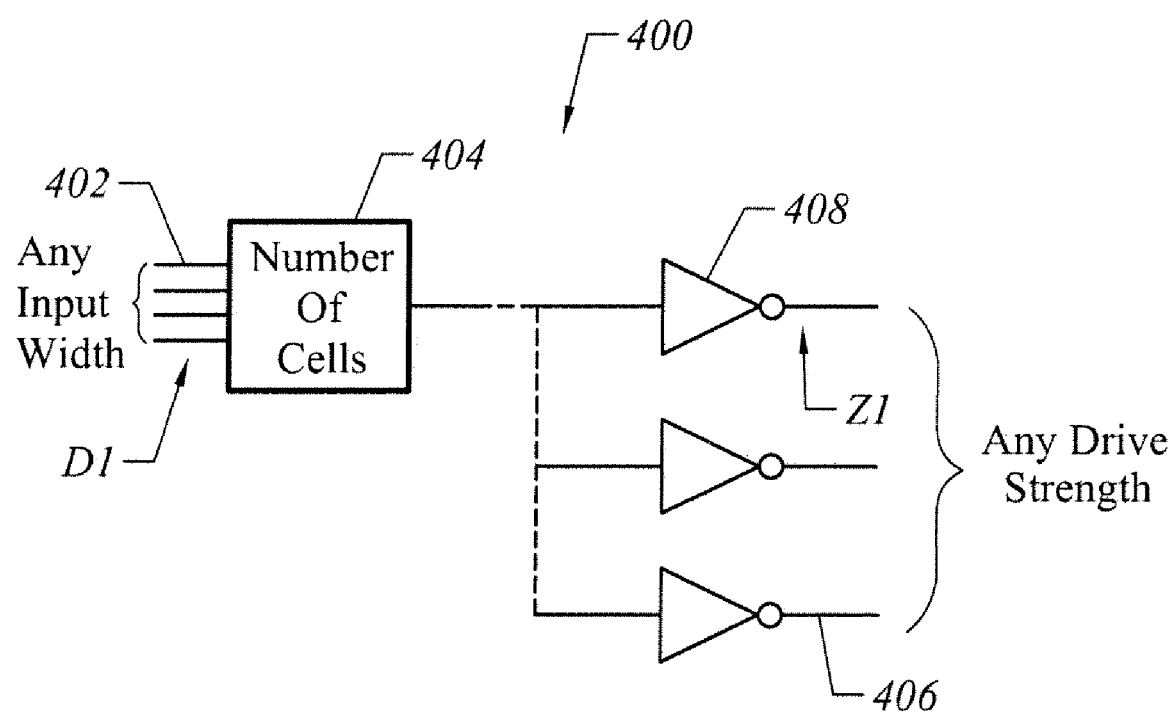
FIG. 4 is a block diagram of multi-driver output configuration in accordance with an embodiment of the invention.

FIG. 4 is a block diagram of a multi-drive driver output configuration in accordance with an embodiment of the invention. Diagram 400 shows any number of cells 404 can be used to generate a driver of any driver strength using any number of inverters and/or drivers 408. In operation, cells 404 accept an input signal into combined inputs ("D1") 402. In response, inverters and/or drivers 408 form an output signal having a corresponding drive strength at output terminals ("Z1") 406, which are coupled together.

Figure 5A:
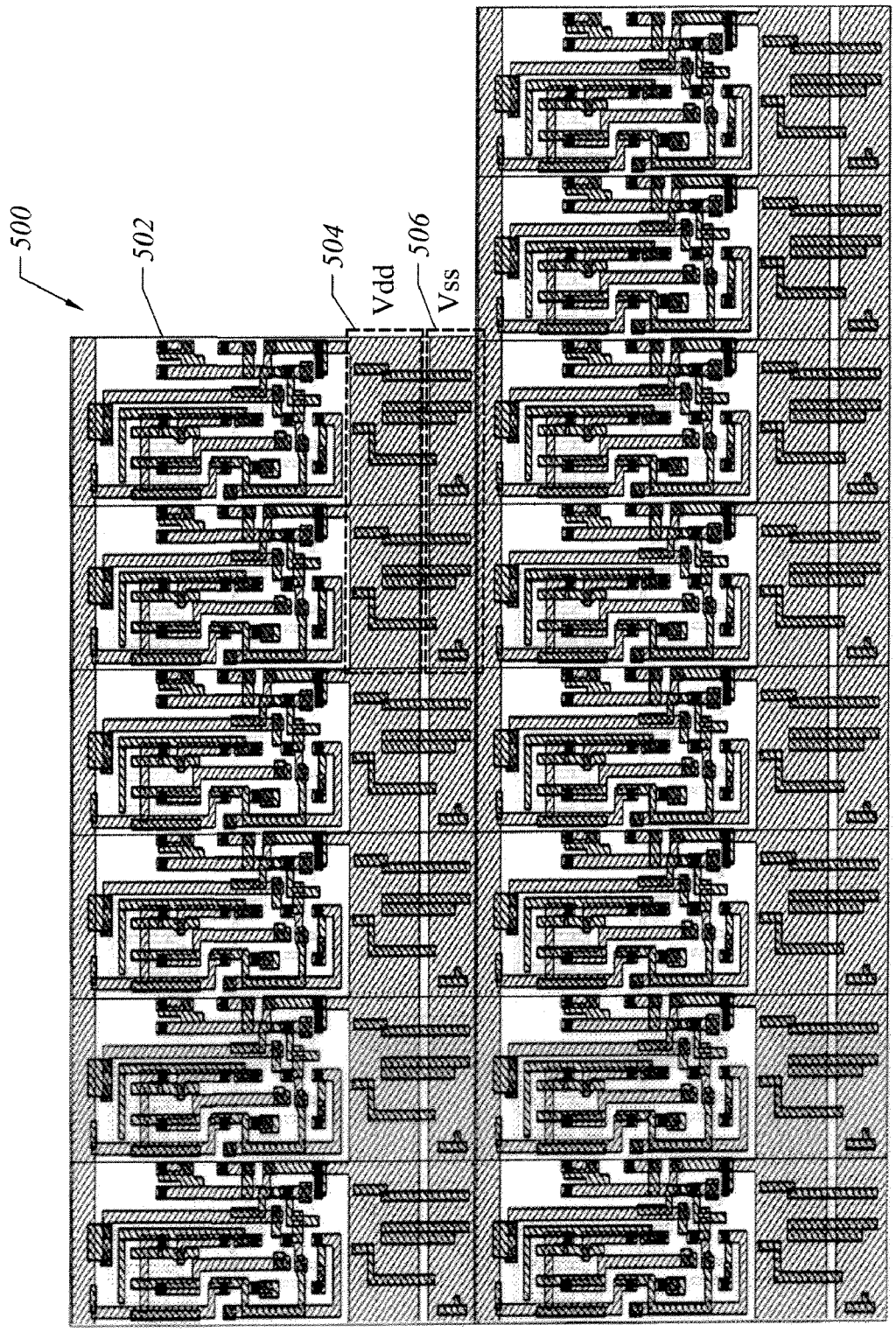
FIGS. 5A and 5B depict a physical view and a logical view, respectively, of a portion of fabric composed of cells, according to an embodiment of the invention.
Figure 5B:
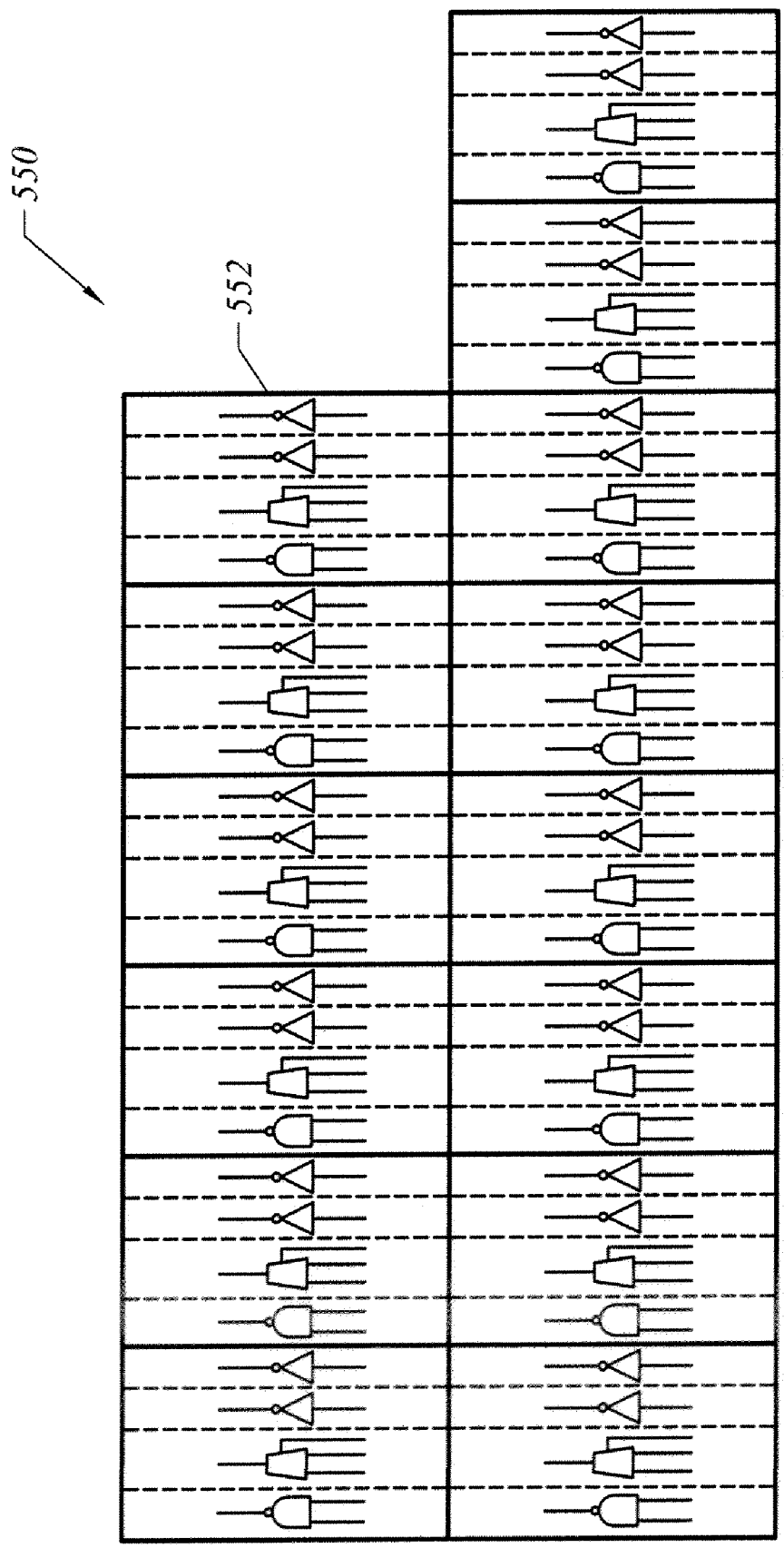

FIGS. 5A and 5B depict a physical view and a logical view, respectively, of a portion of fabric composed of cells, according to an embodiment of the invention. FIG. 5A shows a fabric portion 500 as a part of an array of cells 502 located adjacent to one another, and can extend in, for example, two dimensions to form an array of cells having any size and almost any shape. In at least one embodiment, cells 502 in an array of cells are contiguous, or at least substantially contiguous to exclude separations through all layers to, for example, accommodate power buses. Rather, each cell 502 includes a first power bus portion 504 (e.g., "Vdd") and a second power bus portion (e.g., "Vss") 506. These power bus portions can be integrated to establish a scalable power supply mesh, for example, in one or more fixed layers to provide a flexible power hookup scheme. Advantageously, the scalable power supply mesh enables fabric portion 500, as well as an array of any number of cells 502, to have access to unfettered power supplies passing through the array. The scalable power supply mesh as described here is in contradistinction to conventional structures for supplying power that require separations between cells, which decreases total circuit density for a customizable logic array device and increases the routing resources to connect power from power buses to customizable logic cells. FIG. 5B shows a fabric portion 550 as a part of an array of cells 552, each cell including circuit elements described in FIGS. 2B and 3A.

Figures 6A, 6B:
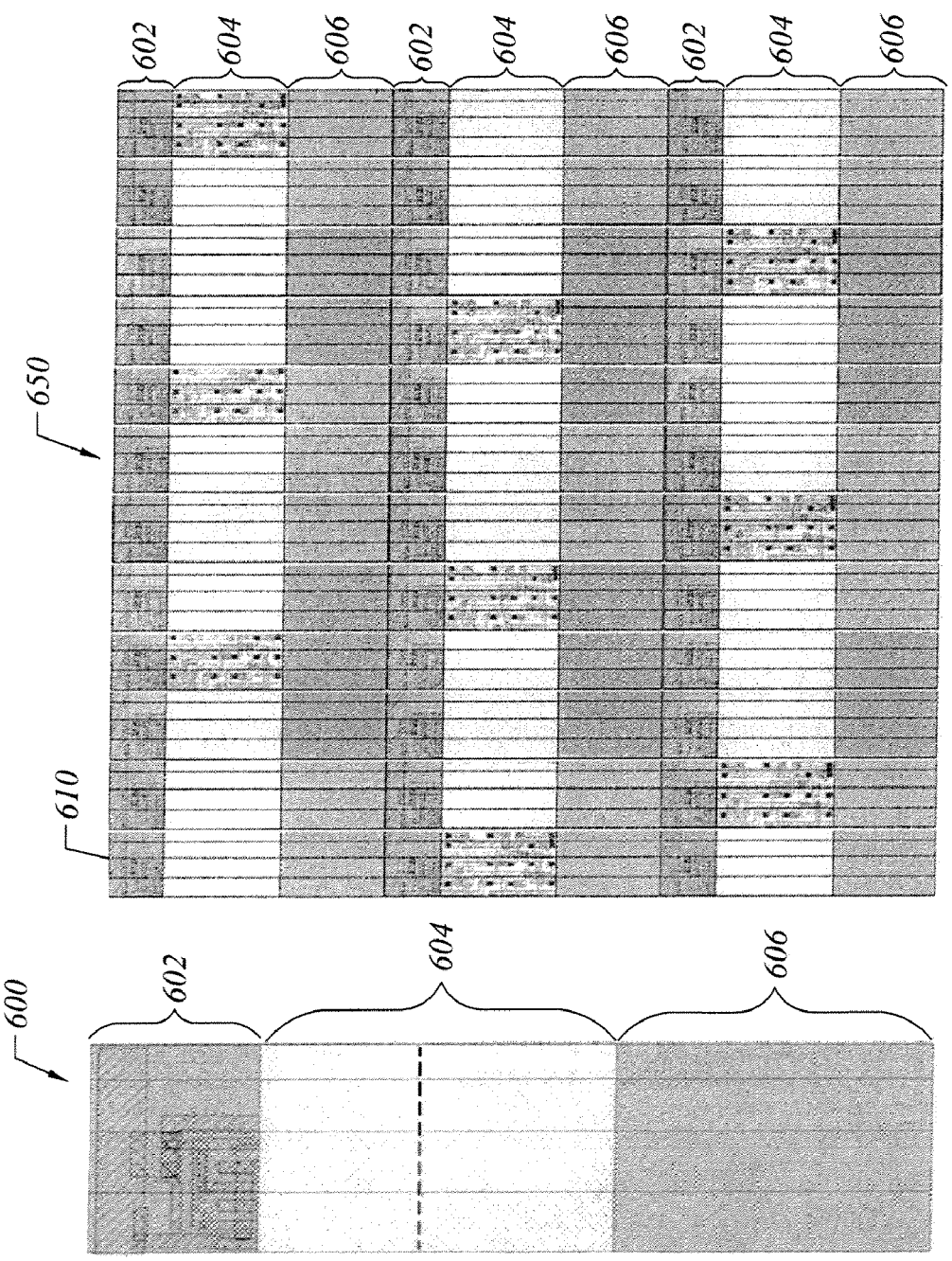
FIGS. 6A and 6B depict differently processed regions for a cell and a fabric portion, respectively, according to an embodiment of the invention.

FIGS. 6A and 6B depict differently processed regions for a cell and a fabric portion, respectively, according to an embodiment of the invention. As shown in FIG. 6A, cell 600 includes at its base layer, or, more specifically, at its semiconductor layer, regions formed by using different semiconductor fabrication technologies. For example, regions 602 and 606 are fabricated to include N-wells and region 604 includes P-wells. As such, PMOS transistors are disposed in regions 602 and 606 and NMOS transistors are disposed in region 604. FIG. 6B shows a fabric portion 650 including cells 610 that are formed over regions 602, 604 and 606. Advantageously, this topology provides for enhanced routing and circuit densities.

Figure 7:
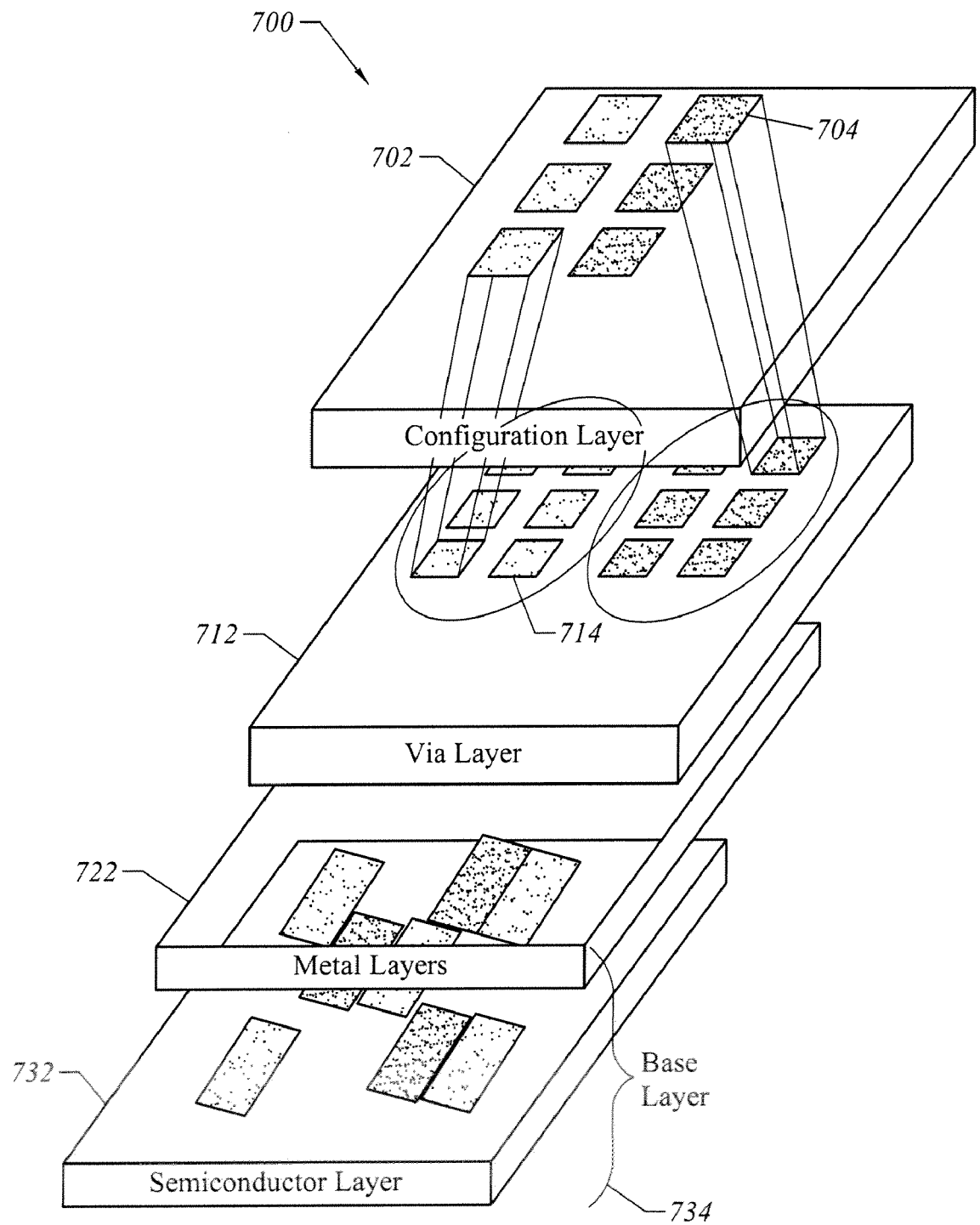
FIG. 7 is an exploded view showing the layers of a cell structure that form a portion of a customizable logic array device, according to at least one specific embodiment of the invention.

FIG. 7 is an exploded view showing the layers of a cell structure for a customizable logic array device, according to at least one specific embodiment of the invention. Cell 700 includes a semiconductor layer 732 and one or more metal layers 722, both of which can constitute a base layer, a via layer 712 and a configuration layer 702. Note that in some embodiments via layer 712 can constitute one or more metal layers 722 (not shown) so that one or more metal layers 722 can be view as one or more intermediate layers. During fabrication of cell 700, semiconductor layer 732 is formed to include the transistors upon which one or more metal layers 722 establish connections to form the circuit elements of cell 700. Next, a via layer 712 is formed to establish vias 714 in alignment with contacts of one or more metal layers 722. At configuration layer 702, terminals 704 are exposed to independently access the circuit elements in base layer 734. Traces can be routed among terminals 704 to, for example, form a higher-level logic device. A flip-flop is an example of such a device. Or, via caps can be formed as terminal 704, which have larger dimensions than corresponding vias 714.

In accordance with at least one embodiment, one or more metal layers 722, via layer 712 and configuration layer 702 are formed using a modified connectivity grid (not shown), which advantageously enhances routing density for cell 700 or any other type of structure that can benefit from using the modified connectivity grid. As a result of using the modified connectivity grid, locating vias 714 at via layer 712 results in violating one or more design rules that govern the manufacturing of cell 700. As will be discussed below, configuration layer 702 can be used to resolve such violations. To illustrate, consider that cell 700 is fabricated as follows. First, a fabrication process forms circuit elements, each including one or more input terminals and one or more output terminals. Next, the manufacturing process places vias 714 at the input terminals and output terminals in violation of a rule defining a minimum separation distance for subsequently formed via caps. At configuration layer 702, traces are routed among terminals 704 to form routed vias that include an amount of area that complies with a rule that sets forth a required amount of via cap area. For other terminals 704 that are not routed, the process forms via caps over these terminals 704 in any direction in which a multi-dimensional via cap can extend at least a minimum separation distance to another conductor. Advantageously, by forming multi-dimensional via caps at unrouted terminals 704 in any direction, the amount of overlap area can resolve the associated design rule violation while facilitating the use of the modified connectivity grid to increase routing density, as compared to the unmodified connectivity grid that complies with a set of design rules.

Figure 8:
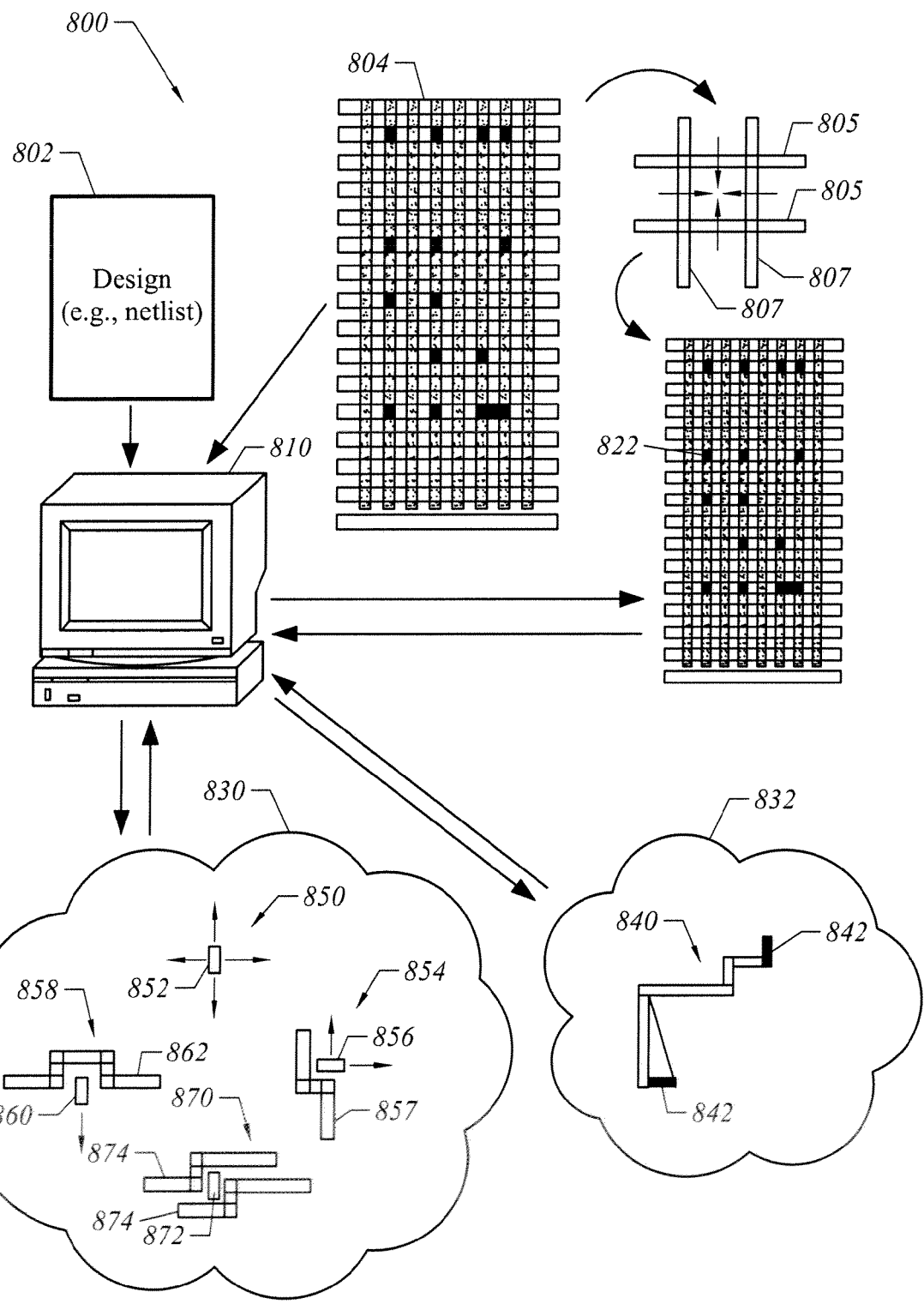
FIG. 8 is graphical representation of a method for increasing routing density in a customizable logic array device, according to at least one specific embodiment of the invention.

FIG. 8 is graphical representation of a method for increasing routing density in a customizable logic array device, according to at least one specific embodiment of the invention. FIG. 8 depicts a flow in which a connectivity grid 804 for manufacturing the customizable logic array device is modified to form a noncompliant connectivity grid 820, and multi-dimensional via caps are formed in association with the noncompliant connectivity grid 820 in either a first direction or a second direction. The second direction is substantially orthogonal to the first direction. To comply with a design rule requiring a minimum area of coverage of via 822, multi-dimensional via caps can be extended in various directions to provide each via 822 with an amount of overlap area for sufficient coverage.

To illustrate the application of this flow to achieve enhanced routing density, consider the following example. A computing device 810 includes a memory storing a program (or executable instructions) and a processor, which operates in accordance with those instructions. The program (not shown) implements a noncompliant connectivity grid 820, which is derived from a routing grid 804 that defines locations at which traces can be routed and vias can be placed, while remaining compliant with a set of design rules. As such, a noncompliant grid does not meet manufacturing (semiconductor fabrication or "fab") design rules. A netlist 802 includes data describing routing connections among vias that is made available to computing device 810 to route traces among some of vias 822.

In at least one embodiment, horizontal grid lines 805 and vertical grid lines 807 are moved to shrink grid 804, which gives rise to rule violations. In particular, modifying connectivity grid 804 includes narrowing grids in a first direction to a first distance to form a first set of narrowed grids, as well as narrowing grids in a second direction to a second distance to form a second set of narrowed grids. Narrowing the grids 805 and 807 to the first distance and the second distance includes sizing the first set of narrowed grids and the second set of narrowed grids, respectively, to accommodate the dimensions of a via 822 in compliance with a design rule. This establishes a boundary about each via 822 that no conductor can contact. Examples of a conductor include such a routing trace and other vias 822. Note that the boundary encloses less area than is required for the amount of overlap area, thereby violating the design rule specifying a minimum overlap area for compliance.

Next, noncompliant connectivity grid 820 is used to form one or more metal layers and one or more configuration layers for increasing routing density in those layers, which, in turn, advantageously opens up more area to route additional traces. The flow can also include generating a via layer for placing vias 822 at locations substantially aligned with noncompliant connectivity grid 820. The flow continues by taking actions 830 and 832 in series or in parallel, or a combination thereof. At the configuration layer, the flow routes traces 840 between vias 842 during action 832 (other traces 840 and vias 842 are not shown), whereby traces 840 provides sufficient overlap area for each via 842 to bring these vias into compliance. During action 830, the flow forms a multi-dimensional via cap in one or more directions (e.g., any direction in 2 dimensions in the plane containing horizontal and vertical grids.). A multi-dimensional via cap is formed in a direction based on the existence of proximate conductors. When there are no proximate conductors at 850, the flow can extend multi-dimensional via cap 852 in any direction, whereas at 854 a proximate conductor 857 limits extension of multi-dimensional via cap 856 to fewer directions (e.g., two directions). At 858, proximate conductor 862 limits extension of multi-dimensional via cap 860 to still fewer directions (e.g., one direction). At 870, proximate conductors 874 prevent formation of a compliant multi-dimensional via cap 872, thereby requiring a degree of rerouting during another action 832 to provide room for the multi-dimensional via cap 872 to expand. Note that the above methods described in connection with FIG. 7 and FIG. 8 can be implemented generally without limitation or restriction to the cell structure described throughout.

Figure 9:
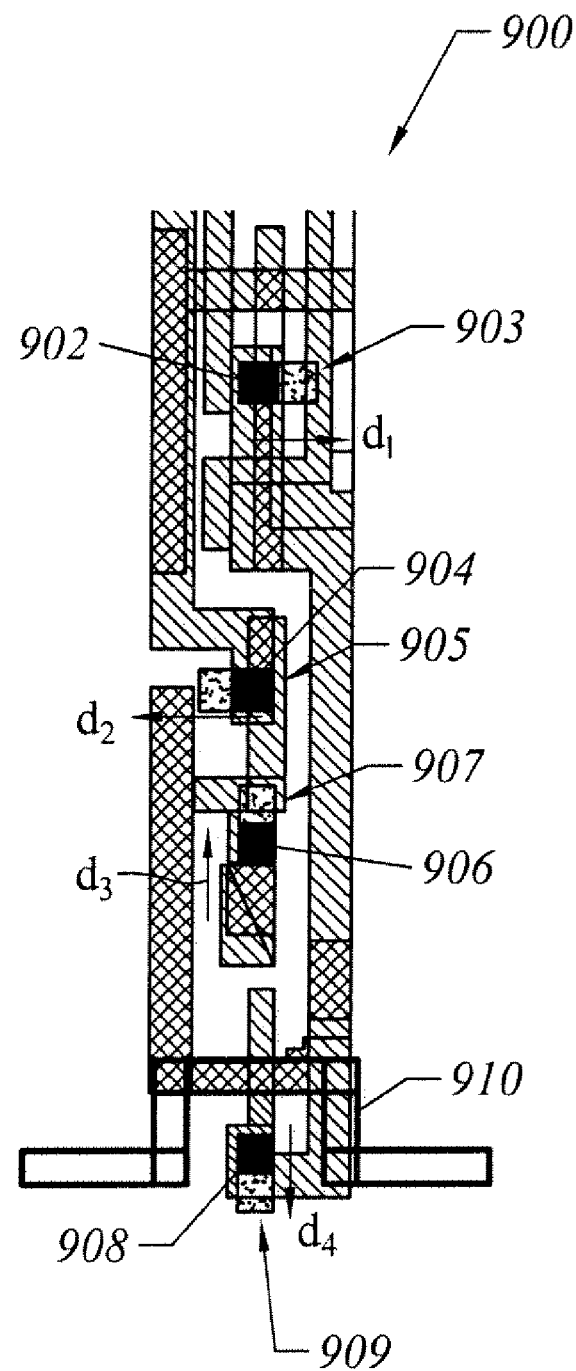
FIG. 9 is diagram of cell in which four vias each has a corresponding via cap extend in one of four directions, according to at least one specific embodiment of the invention.

FIG. 9 is diagram of cell in which four vias each has a corresponding via cap extend in one of four directions, according to at least one specific embodiment of the invention. In particular, via cap 903 extends from via 902 in direction, d1, whereas via cap 905 extends from via 904 in direction, d2. Similarly, via cap 907 extends from via 906 in direction, d3. And via cap 909 extends from via 908 in direction, d4, which is away from conductor 910.

Figures 10A, 10B:
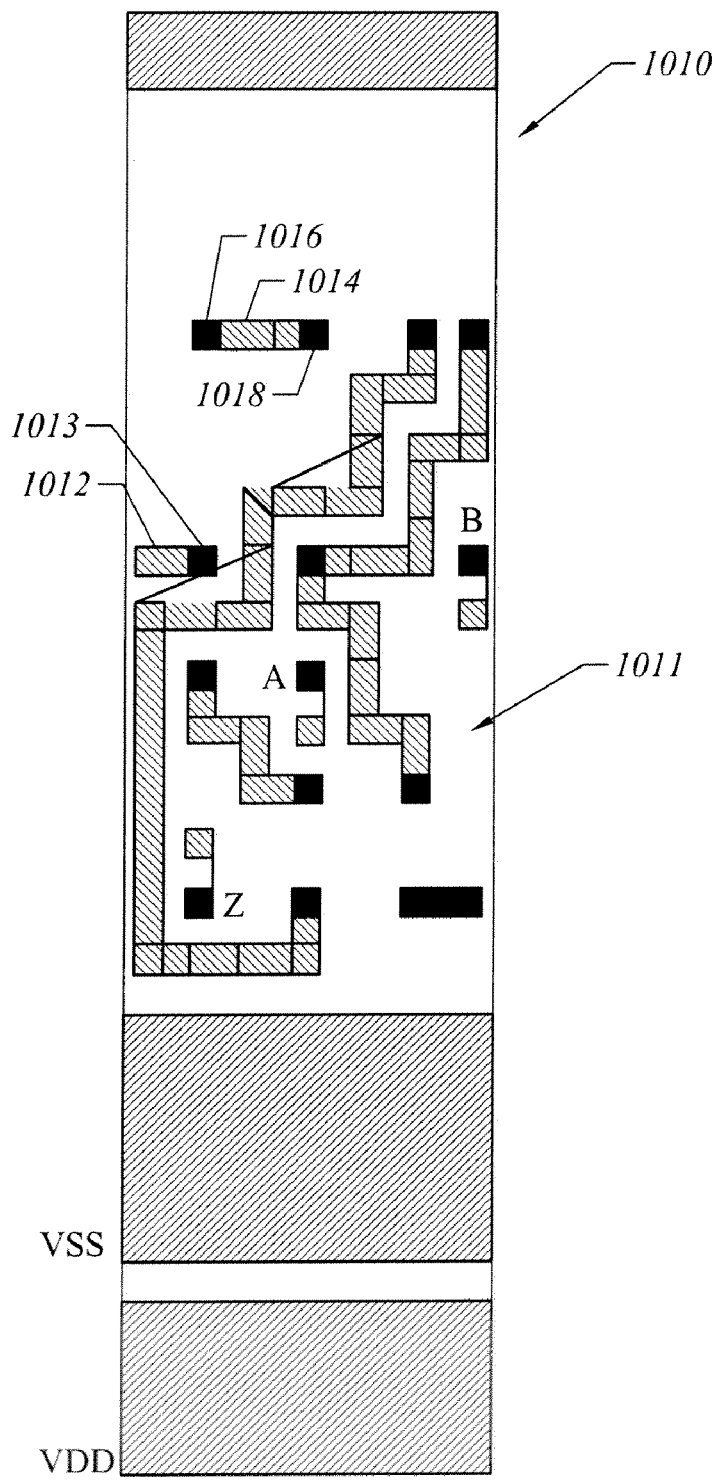
Figures 12A, 12B:
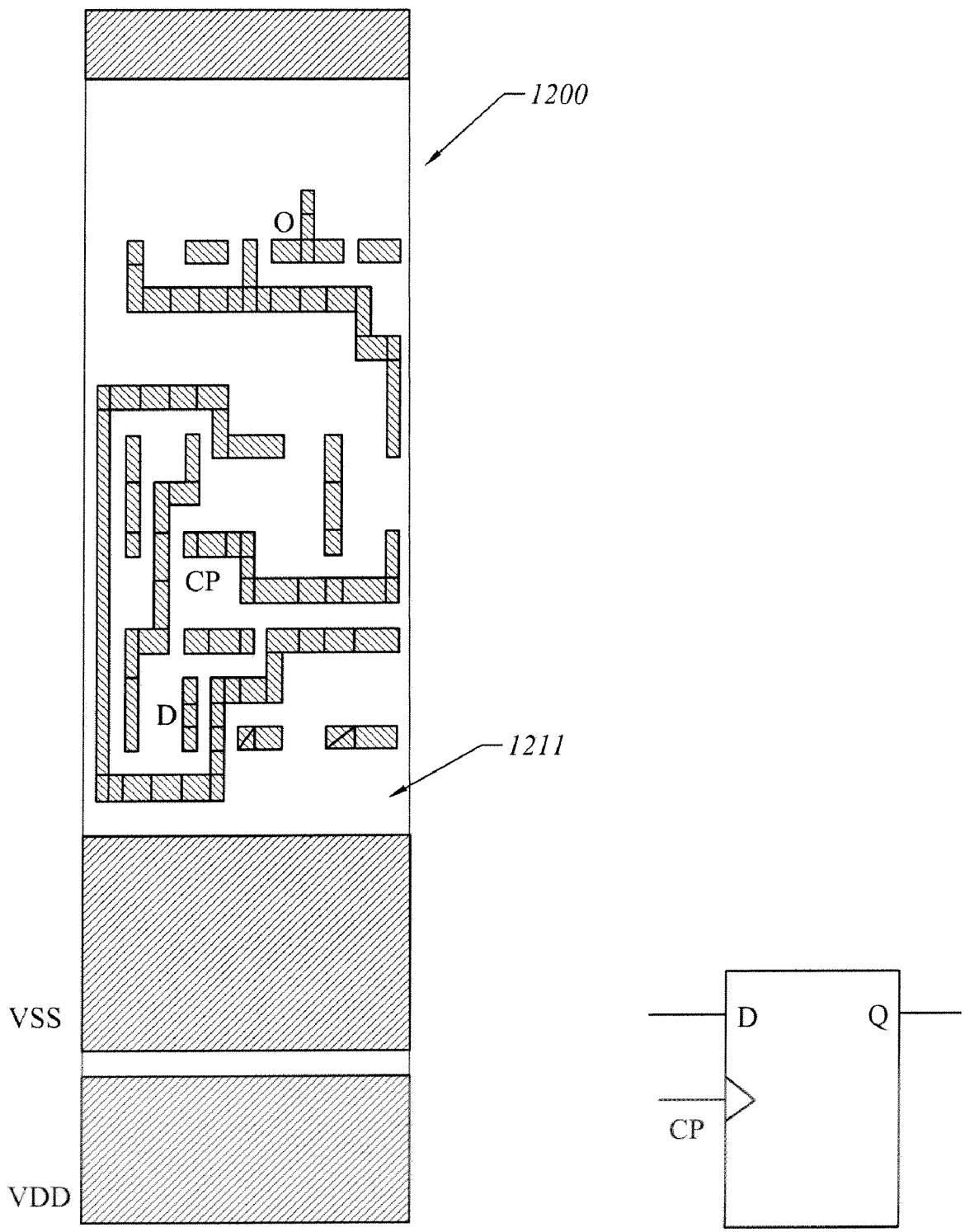

FIGS. 10A to 13B are plan views for examples of cell structures configured to implement various high-level logic devices, according to various embodiments of the invention. FIG. 10A is a plan view of a cell 1010 configured at configuration layer 1011 as an XNOR gate having drive strength based on a single driver. Note that via cap 1012 extends from via 1013 to increase its area, whereas trace 1014 facilitates compliance of vias 1016 and 1018. FIG. 10B is a schematic representation depicting the functionality of cell 1010. FIG. 11A is a plan view of a cell 1100 that is configured at configuration layer 1111 as an XNOR gate having dual drive strength based on two parallel drivers. FIG. 10B is a schematic representation depicting the functionality of cell 1100. FIG. 12A is a plan view of a cell 1200 configured at configuration layer 1211 as a basic D flip flop. FIG. 12B is a schematic representation depicting the functionality of cell 1200. FIG. 13A is a plan view of a cell 1300 that is configured at configuration layer 1311 as a D flip flop having set and reset inputs. FIG. 13B is a schematic representation depicting the functionality of cell 1300.

An embodiment of the present invention relates to a computer storage product with a computer-readable medium having computer code thereon for performing various computer-implemented operations. The media and computer code may be those specially designed and constructed for the purposes of the invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits ("ASICs"), programmable logic devices ("PLDs") and ROM and RAM devices. Examples of computer code include machine code, such as produced by a compiler, and files containing higher-level code that are executed by a computer using an interpreter. For example, an embodiment of the invention can be implemented using Java, C++, or other object-oriented programming language and development tools. Another embodiment of the invention can be implemented in hardwired circuitry in place of, or in combination with, machine-executable software instructions.

The foregoing description, for purposes of explanation, used specific nomenclature to provide a thorough understanding of the invention. However, it will be apparent to one skilled in the art that specific details are not required in order to practice the invention. In fact, this description should not be read to limit any feature or aspect of the invention to any embodiment; rather features and aspects of one embodiment may readily be interchanged with other embodiments. For example, while the techniques and structures have been described in application to cells and customizable logic array devices, an ordinarily skilled artisan should appreciate that the teachings described herein can apply to any other type of circuitry and/or device.

Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications; they thereby enable others skilled in the art to best utilize the invention and various embodiments with various modifications as are suited to the particular use contemplated. Notably, not every benefit described herein need be realized by each embodiment of the invention; rather any specific embodiment can provide one or more of the advantages discussed above. It is intended that the following claims and their equivalents define the scope of the invention.

The invention claimed is:

1. A method for increasing routing density in cells of a customizable logic array device, wherein the method is implemented in a computer system comprising a processor configured to operate in accordance with executable instructions, the method comprising:
   executing, on the processor of the computer system, one or more executable instructions that modify a connectivity grid for manufacturing said customizable logic array device to form a noncompliant connectivity grid, wherein modifying said connectivity grid includes
      narrowing grids in a first direction to a first distance to form a first set of narrowed grids, and
      narrowing grids in a second direction to a second distance to form a second set of narrowed grids, said second direction substantially orthogonal to said first direction; and
   executing, on the processor of the computer system, one or more executable instructions that form via caps in association with said noncompliant connectivity grid, wherein said via caps provide each via with an amount of overlap area for bringing each via into compliance with a design rule coverage.

2. The method of claim 1 wherein forming said via caps in association with said noncompliant connectivity grid includes forming said via caps in either said first direction or said second direction.

3. The method of claim 1 further comprising executing, on the processor of the computer system, one or more executable instructions that establish one or more layers of a cell using said noncompliant connectivity grid.

4. The method of claim 3 wherein establishing said one or more layers includes generating a via layer for placing vias at locations substantially aligned with said noncompliant connectivity grid.

5. The method of claim 4 wherein establishing said one or more layers includes generating a configuration layer for routing among a subset of said vias.

6. The method of claim 5 wherein routing between said subset of said vias provides at least said amount of overlap area for each via in said subset.

7. The method of claim 4 wherein generating said configuration layer includes forming at least one of said via caps for an unrouted via that is not part of said subset.

8. The method of claim 1, wherein narrowing grids to said first distance and said second distance includes sizing said first set of narrowed grids and said second set of narrowed grids, respectively, to accommodate the dimensions of a via in compliance with a design rule.

9. The method of claim 8 wherein sizing said first set of narrowed grids and said second set of narrowed grids further comprises establishing a boundary about said via with which no conductor can contact.

10. The method of claim 9 wherein said boundary encloses less area than is required for said amount of overlap area, thereby violating another design rule specifying a minimum overlap area for compliance.

11. The method of claim 9 wherein said conductor is either a routing trace or another via, said another via being located at an intersection of one grid from said first set and another grid from said second set.

12. The method of claim 1, wherein at least one distance of the non-compliant connectivity grid violates a minimum separation rule.

13. A method for manufacturing cells of a customizable logic array device having an enhanced routing density, the method comprising:
    forming circuit elements including one or more input terminals and one or more output terminals;
    placing vias at said input terminals and said output terminals in violation of a rule defining a minimum separation, wherein placing said vias includes
        forming said vias at locations determined in accordance with a non-compliant connectivity grid to connect said input terminals and said output terminals to other locations at which at least said via caps are formed, wherein at least one distance measurement of the non-compliant connectivity grid violates said minimum separation rule;
    routing traces among said vias to form routed vias that include an amount of area that complies with another rule; and
    forming via caps on remaining vias in any direction in which a via cap extends at least said minimum separation,
    wherein said via cap provides an amount of overlap area in compliance with said another rule defining a minimum amount of via cap area.

14. The method of claim 13, wherein routing said traces along said resized grid has an increased routing density compared to said grid.

15. The method of claim 13 wherein forming said via caps includes determining for each of said remaining vias that one or more directions in which said via cap extends at least said minimum separation, wherein said one or more directions include a first direction and a second direction substantially orthogonal to said first direction.

16. A computer readable medium bearing executable instructions for forming a flip flop from one or more cells of a customizable logic array device having an enhanced routing density, wherein the executable instructions cause a processor, operating in accordance with said executable instructions, to:
    establish in one or more base layers a multiplexer, a NAND gate, and one or more inverters, each of which includes one or more input terminals and one or more output terminals;
    interconnect one or more configuration layers to said one or more base layers to form connections at locations that deviate from recommended locations;
    route traces among a first subset of said connections to form said flip flop from said multiplexer, said NAND gate, and said one or more inverters; and
    cap a second subset of said connections each with an overlap area compliant with a predetermined minimum amount of area, wherein
    said enhanced routing density is obtained by narrowing grids of said traces in a first direction to a first distance to form a first set of narrowed grids and narrowing grids of said traces in a second direction to a second distance to form a second set of narrowed grids.

17. The computer readable medium of claim 16, wherein said second direction is substantially orthogonal to said first direction.

18. The computer readable medium of claim 16, wherein the executable instructions further cause said processor to determine locations at which to place vias.

19. The computer readable medium of claim 18, wherein the executable instructions further cause said processor to form said vias at said locations, wherein said locations correspond to said connections.

20. The computer readable medium of claim 16, wherein the at least one of the first and second distances violates a minimum separation rule.

* * * * *